United States Patent [19]

Ino

[11] Patent Number: 5,638,063
[45] Date of Patent: Jun. 10, 1997

[54] CODE MODULATION METHOD, CODE DEMODULATION METHOD, AND CODE DETECTION METHOD

[75] Inventor: Hiroyuki Ino, Chiba, Japan

[73] Assignee: Sony Corporation, Tokyo, Japan

[21] Appl. No.: 579,002

[22] Filed: Dec. 27, 1995

[30] Foreign Application Priority Data

Dec. 28, 1994 [JP] Japan ................................. 6-326947

[51] Int. Cl.$^6$ ................................................ H03M 7/00
[52] U.S. Cl. .................................................... 341/50
[58] Field of Search ................................ 341/50, 107, 58, 341/56, 102

*Primary Examiner*—Brian K. Young
*Attorney, Agent, or Firm*—Limbach & Limbach L.L.P.

[57] ABSTRACT

Carrying out DSV control with a PR(1, 1) while making free distance larger and path memory length shorter. "3×3" states are arranged in a plane defined by a horizontal axis and a vertical axis, with a code 11 being allotted to correspond to rightward transitions along the horizontal axis and a code 00 being allotted to correspond to leftward transitions. A code 01 is allotted to upward transitions along the vertical axis and a code 10 is allotted to correspond to downward transitions. Codes obtained in the case of transitions from a start point taken as one of the states 1, 3, 5 or 7, to the states 1, 3, 5 or 7 taken as end points through the other five states are used as codes after conversion. For example, the codes 01, 01, 11, 00, 10 and 10 are obtained from a transition through state 1, state 4, state 7, state 8, state 7, state 4 and state 1.

11 Claims, 15 Drawing Sheets

1 modulator 8 demodulator

FIG. 6

Table 1, start point: state 1, end point: state 1

| | | | | | |
|---|---|---|---|---|---|
| 1478741 | 010111001010 | 1410341 | 011000011110 | 1452121 | 011110001100 |
| | | 1210341 | 110000011110 | 1252121 | 110110001100 |
| 1458741 | 011101001010 | 1010341 | 001100011110 | 1412121 | 011011001100 |
| 1258741 | 110101001010 | 1474141 | 010110100110 | 1212121 | 110011001100 |
| 1476741 | 010100111010 | 1454141 | 011100100110 | 1012121 | 001111001100 |
| 1436741 | 010001111010 | 1254141 | 110100100110 | 1430121 | 010010111100 |
| 1036741 | 000101111010 | 1434141 | 010011100110 | 1030121 | 000110111100 |
| 1474741 | 010110011010 | 1034141 | 000111100110 | 1410121 | 011000111100 |
| 1454741 | 011100011010 | 1414141 | 011001100110 | 1210121 | 110000111100 |
| 1254741 | 110100011010 | 1214141 | 110001100110 | 1010121 | 001100111100 |
| 1434741 | 010011011010 | 1014141 | 001101100110 | 1476301 | 010100101011 |
| 1034741 | 000111011010 | 1452141 | 011110000110 | 1436301 | 010001101011 |
| 1414741 | 011001011010 | 1252141 | 110110000110 | 1036301 | 000101101011 |
| 1214741 | 110001011010 | 1412141 | 011011000110 | 1474301 | 010110001011 |
| 1014741 | 001101011010 | 1212141 | 110011000110 | 1454301 | 011100001011 |
| 1478541 | 010111100010 | 1012141 | 001111000110 | 1254301 | 110100001011 |
| 1458541 | 011101100010 | 1430141 | 010010110110 | 1434301 | 010011001011 |
| 1258541 | 110101100010 | 1030141 | 000110110110 | 1034301 | 000111001011 |
| 1474541 | 010110110010 | 1410141 | 011000110110 | 1414301 | 011001001011 |
| 1454541 | 011100110010 | 1210141 | 110000110110 | 1214301 | 110001001011 |
| 1254541 | 110100110010 | 1010141 | 001100110110 | 1014301 | 001101001011 |
| 1434541 | 010011110010 | 1478521 | 010111101000 | 1430301 | 010010011011 |
| 1034541 | 000111110010 | 1458521 | 011101101000 | 1030301 | 000110011011 |
| 1414541 | 011001110010 | 1258521 | 110101101000 | 1410301 | 011000011011 |
| 1214541 | 110001110010 | 1474521 | 010110111000 | 1210301 | 110000011011 |
| 1014541 | 001101110010 | 1454521 | 011100111000 | 1010301 | 001100011011 |
| 1452541 | 011110010010 | 1254521 | 110100111000 | 1474101 | 010110100011 |
| 1252541 | 110110010010 | 1434521 | 010011111000 | 1454101 | 011100100011 |
| 1412541 | 011011010010 | 1034521 | 000111111000 | 1254101 | 110100100011 |
| 1212541 | 110011010010 | 1414521 | 011001111000 | 1434101 | 010011100011 |
| 1012541 | 001111010010 | 1214521 | 110001111000 | 1034101 | 000111100011 |
| 1476341 | 010100101110 | 1014521 | 001101111000 | 1414101 | 011001100011 |
| 1436341 | 010001101110 | 1452521 | 011110011000 | 1214101 | 110001100011 |
| 1036341 | 000101101110 | 1252521 | 110110011000 | 1014101 | 001101100011 |
| 1474341 | 010110001110 | 1412521 | 011011011000 | 1452101 | 011110000011 |
| 1454341 | 011100001110 | 1212521 | 110011011000 | 1252101 | 110110000011 |
| 1254341 | 110100001110 | 1012521 | 001111011000 | 1412101 | 011011000011 |
| 1434341 | 010011001110 | 1474121 | 010110101100 | 1212101 | 110011000011 |
| 1034341 | 000111001110 | 1454121 | 011100101100 | 1012101 | 001111000011 |
| 1414341 | 011001001110 | 1254121 | 110100101100 | 1430101 | 010010110011 |
| 1214341 | 110001001110 | 1434121 | 010011101100 | 1030101 | 000110110011 |
| 1014341 | 001101001110 | 1034121 | 000111101100 | 1410101 | 011000110011 |
| 1430341 | 010010011110 | 1414121 | 011001101100 | 1210101 | 110000110011 |
| 1030341 | 000110011110 | 1214121 | 110001101100 | 1010101 | 001100110011 |
| | | 1014121 | 001101101100 | | |

FIG. 7

Table 1, start point: state 1, end point: state 3

| | | | | | |
|---|---|---|---|---|---|
| 1478763 | 010111000010 | 1014743 | 001101011000 | 1012143 | 001111000100 |
| 1458763 | 011101000010 | 1478543 | 010111100000 | 1430143 | 010010110100 |
| 1258763 | 110101000010 | 1458543 | 011101100000 | 1030143 | 000110110100 |
| 1476763 | 010100110010 | 1258543 | 110101100000 | 1410143 | 011000110100 |
| 1436763 | 010001110010 | 1474543 | 010110110000 | 1210143 | 110000110100 |
| 1036763 | 000101110010 | 1454543 | 011100110000 | 1010143 | 001100110100 |
| 1474763 | 010110010010 | 1254543 | 110100110000 | 1476303 | 010100101001 |
| 1454763 | 011100010010 | 1434543 | 010011110000 | 1436303 | 010001101001 |
| 1254763 | 110100010010 | 1034543 | 000111110000 | 1036303 | 000101101001 |
| 1434763 | 010011010010 | 1414543 | 011001110000 | 1474303 | 010110001001 |
| 1034763 | 000111010010 | 1214543 | 110001110000 | 1454303 | 011100001001 |
| 1414763 | 011001010010 | 1014543 | 001101110000 | 1254303 | 110100001001 |
| 1214763 | 110001010010 | 1452543 | 011110010000 | 1434303 | 010011001001 |
| 1014763 | 001101010010 | 1252543 | 110110010000 | 1034303 | 000111001001 |
| 1476363 | 010100100110 | 1412543 | 011011010000 | 1414303 | 011001001001 |
| 1436363 | 010001100110 | 1212543 | 110011010000 | 1214303 | 110001001001 |
| 1036363 | 000101100110 | 1012543 | 001111010000 | 1014303 | 001101001001 |
| 1474363 | 010110000110 | 1476343 | 010100101100 | 1430303 | 010010011001 |
| 1454363 | 011100000110 | 1436343 | 010001101100 | 1030303 | 000110011001 |
| 1254363 | 110100000110 | 1036343 | 000101101100 | 1410303 | 011000011001 |
| 1434363 | 010011000110 | 1474343 | 010110001100 | 1210303 | 110000011001 |
| 1034363 | 000111000110 | 1454343 | 011100001100 | 1010303 | 001100011001 |
| 1414363 | 011001000110 | 1254343 | 110100001100 | 1474103 | 010110100001 |
| 1214363 | 110001000110 | 1434343 | 010011001100 | 1454103 | 011100100001 |
| 1014363 | 001101000110 | 1014343 | 000111001100 | 1254103 | 110100100001 |
| 1430363 | 010010010110 | 1414343 | 011001001100 | 1434103 | 010011100001 |
| 1030363 | 000110010110 | 1214343 | 110001001100 | 1034103 | 000111100001 |
| 1410363 | 011000010110 | 1014343 | 001101001100 | 1414103 | 011001100001 |
| 1210363 | 110000010110 | 1430343 | 010010011100 | 1214103 | 110001100001 |
| 1010363 | 001100010110 | 1030343 | 000110011100 | 1014103 | 001101100001 |
| 1478743 | 010111001000 | 1410343 | 011000011100 | 1452103 | 011110000001 |
| 1458743 | 011101001000 | 1210343 | 110000011100 | 1252103 | 110110000001 |
| 1258743 | 110101001000 | 1010343 | 001100011100 | 1412103 | 011011000001 |
| 1476743 | 010100111000 | 1474143 | 010110100100 | 1212103 | 110011000001 |
| 1436743 | 010001111000 | 1454143 | 011100100100 | 1012103 | 001111000001 |
| 1036743 | 000101111000 | 1254143 | 110100100100 | 1430103 | 010010110001 |
| 1474743 | 010110011000 | 1434143 | 010011100100 | 1030103 | 000110110001 |
| 1454743 | 011100011000 | 1034143 | 000111100100 | 1410103 | 011000110001 |
| 1254743 | 110100011000 | 1414143 | 011001100100 | 1210103 | 110000110001 |
| 1434743 | 010011011000 | 1214143 | 110001100100 | 1010103 | 001100110001 |
| 1034743 | 000111011000 | 1014143 | 001101100100 | | |
| 1414743 | 011001011000 | 1452143 | 011110000100 | | |
| 1214743 | 110001011000 | 1252143 | 110110000100 | | |
| | | 1412143 | 011011000100 | | |
| | | 1212143 | 110011000100 | | |

FIG. 8

Table 1, start point: state 1, end point: state 5

| | |
|---|---|
| 1478785 | 010111001110 |
| 1458785 | 011101001110 |
| 1258785 | 110101001110 |
| 1478785 | 010100111110 |
| 1436785 | 010001111110 |
| 1036785 | 000101111110 |
| 1474785 | 010110011110 |
| 1454785 | 011100011110 |
| 1254785 | 110100011110 |
| 1434785 | 010011011110 |
| 1034785 | 000111011110 |
| 1414785 | 011001011110 |
| 1214785 | 110001011110 |
| 1014785 | 001101011110 |
| 1478585 | 010011100110 |
| 1458585 | 011101100110 |
| 1258585 | 110101100110 |
| 1474585 | 010110110110 |
| 1454585 | 011100110110 |
| 1254585 | 110100110110 |
| 1434585 | 010011110110 |
| 1034585 | 000111110110 |
| 1414585 | 011001110110 |
| 1214585 | 110001110110 |
| 1014585 | 001101110110 |
| 1452585 | 011110010110 |
| 1252585 | 110110010110 |
| 1412585 | 011011010110 |
| 1212585 | 110011010110 |
| 1012585 | 001111010110 |
| 1478745 | 010111001011 |
| 1458745 | 011101001011 |
| 1258745 | 110101001011 |
| 1476745 | 010100111011 |
| 1436745 | 010001111011 |
| 1036745 | 000101111011 |
| 1474745 | 010110011011 |
| 1454745 | 011100011011 |
| 1254745 | 110100011011 |
| 1434745 | 010011011011 |
| 1034745 | 000111011011 |
| 1414745 | 011001011011 |
| 1214745 | 110001011011 |
| 1014745 | 001101011011 |
| 1478545 | 010111100011 |
| 1458545 | 011101100011 |
| 1258545 | 110101100011 |
| 1474545 | 010110110011 |
| 1454545 | 011100110011 |
| 1254545 | 110100110011 |
| 1434545 | 010011110011 |
| 1034545 | 000111110011 |
| 1414545 | 011001110011 |
| 1214545 | 110001110011 |
| 1014545 | 001101110011 |
| 1452545 | 011110010011 |
| 1252545 | 110110010011 |
| 1412545 | 011011010011 |
| 1212545 | 110011010011 |
| 1012545 | 001111010011 |
| 1476345 | 010100101111 |
| 1436345 | 010001101111 |
| 1036345 | 000101101111 |
| 1474345 | 010110001111 |
| 1454345 | 011100001111 |
| 1254345 | 110100001111 |
| 1434345 | 010011001111 |
| 1034345 | 000111001111 |
| 1414345 | 011001001111 |
| 1214345 | 110001001111 |
| 1014345 | 001101001111 |
| 1430345 | 010010011111 |
| 1030345 | 000110011111 |
| 1410345 | 011000011111 |
| 1210345 | 110000011111 |
| 1010345 | 001100011111 |
| 1474145 | 010110100111 |
| 1454145 | 011100100111 |
| 1254145 | 110100100111 |
| 1434145 | 010011100111 |
| 1034145 | 000111100111 |
| 1414145 | 011001100111 |
| 1214145 | 110001100111 |
| 1014145 | 001101100111 |
| 1452145 | 011110000111 |
| 1252145 | 110110000111 |
| 1412145 | 011011000111 |
| 1212145 | 110011000111 |
| 1012145 | 001111000111 |
| 1430145 | 010010110111 |
| 1030145 | 000110110111 |
| 1410145 | 011000110111 |
| 1210145 | 110000110111 |
| 1010145 | 001100110111 |
| 1478525 | 010111101001 |
| 1458525 | 011101101001 |
| 1258525 | 110101101001 |
| 1474525 | 010110111001 |
| 1454525 | 011100111001 |
| 1254525 | 110100111001 |
| 1434525 | 010011111001 |
| 1034525 | 000111111001 |
| 1414525 | 011001111001 |
| 1214525 | 110001111001 |
| 1014525 | 001101111001 |
| 1452525 | 011110011001 |
| 1252525 | 110110011001 |
| 1412525 | 011011011001 |
| 1212525 | 110011011001 |
| 1012525 | 001111011001 |
| 1474125 | 010110101101 |
| 1455125 | 011100101101 |
| 1254125 | 110100101101 |
| 1434125 | 010011101101 |
| 1034125 | 000111101101 |
| 1414125 | 011001101101 |
| 1214125 | 110001101101 |
| 1014125 | 001101101101 |
| 1452125 | 011110001101 |
| 1252125 | 110110001101 |
| 1412125 | 011011001101 |
| 1212125 | 110011001101 |
| 1012125 | 001111001101 |
| 1430125 | 010010111101 |
| 1030125 | 000110111101 |
| 1410125 | 011000111101 |
| 1210125 | 110000111101 |
| 1010125 | 001100111101 |

FIG. 9

Table 1, start point: state 1, end point: state 7

| | |
|---|---|
| 1478787 | 010111001100 |
| 1458787 | 011101001100 |
| 1258787 | 110101001100 |
| 1476787 | 010100111100 |
| 1436787 | 010001111100 |
| 1036787 | 000101111100 |
| 1474787 | 010110011100 |
| 1454787 | 011100011100 |
| 1254787 | 110100011100 |
| 1434787 | 010011011100 |
| 1034787 | 000111011100 |
| 1414787 | 011001011100 |
| 1214787 | 110001011100 |
| 1014787 | 001101011100 |
| 1478587 | 010111100100 |
| 1458587 | 011101100100 |
| 1258587 | 110101100100 |
| 1474587 | 010110110100 |
| 1454587 | 011100110100 |
| 1254587 | 110100110100 |
| 1434587 | 010011110100 |
| 1034587 | 000111110100 |
| 1414587 | 011001110100 |
| 1214587 | 110001110100 |
| 1014587 | 001101110100 |
| 1452587 | 011110010100 |
| 1252587 | 110110010100 |
| 1412587 | 011011010100 |
| 1212587 | 110011010100 |
| 1012587 | 001111010100 |
| 1478767 | 010111000011 |
| 1458767 | 011101000011 |
| 1258767 | 110101000011 |
| 1476767 | 010100110011 |
| 1436767 | 010001110011 |
| 1036767 | 000101110011 |
| 1474767 | 010110010011 |
| 1454767 | 011100010011 |
| 1254767 | 110100010011 |
| 1434767 | 010011010011 |
| 1034767 | 000111010011 |
| 1414767 | 011001010011 |
| 1214767 | 110001010011 |
| 1014767 | 001101010011 |
| 1476367 | 010100100111 |
| 1436367 | 010001100111 |
| 1036367 | 000101100111 |
| 1474367 | 010110000111 |
| 1454367 | 011100000111 |
| 1254367 | 110100000111 |
| 1434367 | 010011000111 |
| 1034367 | 000111000111 |
| 1414367 | 011001000111 |
| 1214367 | 110001000111 |
| 1014367 | 001101000111 |
| 1430367 | 010010010111 |
| 1030367 | 000110010111 |
| 1410367 | 011000010111 |
| 1210367 | 110000010111 |
| 1010367 | 001100010111 |
| 1478747 | 010111001001 |
| 1458747 | 011101001001 |
| 1258747 | 110101001001 |
| 1476747 | 010100111001 |
| 1436747 | 010001111001 |
| 1036747 | 000101111001 |
| 1474747 | 010110011001 |
| 1454747 | 011100011001 |
| 1254747 | 110100011001 |
| 1434747 | 010011011001 |
| 1034747 | 000111011001 |
| 1414747 | 011001011001 |
| 1214747 | 110001011001 |
| 1014747 | 001101011001 |
| 1478547 | 010111100001 |
| 1458547 | 011101100001 |
| 1258547 | 110101100001 |
| 1474547 | 010110110001 |
| 1454547 | 011100110001 |
| 1254547 | 110100110001 |
| 1434547 | 010011110001 |
| 1034547 | 000111110001 |
| 1414547 | 011001110001 |
| 1214547 | 110001110001 |
| 1014547 | 001101110001 |
| 1452547 | 011110010001 |
| 1252547 | 110110010001 |
| 1412547 | 011011010001 |
| 1212547 | 110011010001 |
| 1012547 | 001111010001 |
| 1476347 | 010100101101 |
| 1436347 | 010001101101 |
| 1036347 | 000101101101 |
| 1474347 | 010110001101 |
| 1454347 | 011100001101 |
| 1254347 | 110100001101 |
| 1434347 | 010011001101 |
| 1034347 | 000111001101 |
| 1414347 | 011001001101 |
| 1214347 | 110001001101 |
| 1014347 | 001101001101 |
| 1430347 | 010010011101 |
| 1030347 | 000110011101 |
| 1410347 | 011000011101 |
| 1210347 | 110000011101 |
| 1010347 | 001100011101 |
| 1474147 | 010110100101 |
| 1454147 | 011100100101 |
| 1254147 | 110100100101 |
| 1434147 | 010011100101 |
| 1034147 | 000111100101 |
| 1414147 | 011001100101 |
| 1214147 | 110001100101 |
| 1014147 | 001101100101 |
| 1452147 | 011110000101 |
| 1252147 | 110110000101 |
| 1412147 | 011011000101 |
| 1212147 | 110011000101 |
| 1012147 | 001111000101 |
| 1430147 | 010010110101 |
| 1030147 | 000110110101 |
| 1410147 | 011000110101 |
| 1210147 | 110000110101 |
| 1010147 | 001100110101 |

FIG. 10

Table 2, start point: state 1, end point: state 1

| | |
|---|---|
| 1478741 | 010111001010 |
| 1458741 | 011101001010 |
| 1258741 | 110101001010 |
| 1476741 | 010100111010 |
| 1436741 | 010001111010 |
| 1036741 | 000101111010 |
| 1474741 | 010110011010 |
| 1454741 | 011100011010 |
| 1254741 | 110100011010 |
| 1434741 | 010011011010 |
| 1034741 | 000111011010 |
| 1414741 | 011001011010 |
| 1214741 | 110001011010 |
| 1014741 | 001101011010 |
| 1478541 | 010111100010 |
| 1458541 | 011101100010 |
| 1258541 | 110101100010 |
| 1474541 | 010110110010 |
| 1476341 | 010100101110 |
| 1436341 | 010001101110 |
| 1036341 | 000101101110 |
| 1474341 | 010110001110 |
| 1474141 | 010110100110 |
| 1478521 | 010111101000 |
| 1458521 | 011101101000 |
| 1258521 | 110101101000 |
| 1474521 | 010110111000 |
| 1474121 | 010110101100 |
| 1476301 | 010100101011 |
| 1436301 | 010001101011 |
| 1036301 | 000101101011 |
| 1474301 | 010110001011 |
| 1474101 | 010110100011 |

FIG. 11

Table 2, start point: state 1, end point: state 3

| | |
|---|---|
| 1478763 | 010111000010 |
| 1458763 | 011101000010 |
| 1258763 | 110101000010 |
| 1476763 | 010100110010 |
| 1436763 | 010001110010 |
| 1036763 | 000101110010 |
| 1474763 | 010110010010 |
| 1454763 | 011100010010 |
| 1254763 | 110100010010 |
| 1434763 | 010011010010 |
| 1034763 | 000111010010 |
| 1414763 | 011001010010 |
| 1214763 | 110001010010 |
| 1014763 | 001101010010 |
| 1476363 | 010100100110 |
| 1436363 | 010001100110 |
| 1036363 | 000101100110 |
| 1474363 | 010110000110 |
| 1454363 | 011100000110 |
| 1254363 | 110100000110 |
| 1434363 | 010011000110 |
| 1034363 | 000111000110 |
| 1414363 | 011001000110 |
| 1214363 | 110001000110 |
| 1014363 | 001101000110 |
| 1430363 | 010010010110 |
| 1030363 | 000110010110 |
| 1410363 | 011000010110 |
| 1210363 | 110000010110 |
| 1010363 | 001100010110 |
| 1478743 | 010111001000 |
| 1458743 | 011101001000 |
| 1258743 | 110101001000 |
| 1476743 | 010100111000 |
| 1436743 | 010001111000 |
| 1036743 | 000101111000 |
| 1474743 | 010110011000 |
| 1454743 | 011100011000 |
| 1254743 | 110100011000 |
| 1434743 | 010011011000 |
| 1034743 | 000111011000 |
| 1414743 | 011001011000 |
| 1214743 | 110001011000 |
| 1014743 | 001101011000 |
| 1478543 | 010111100000 |
| 1458543 | 011101100000 |
| 1258543 | 110101100000 |
| 1474543 | 010110110000 |
| 1476343 | 010100101100 |
| 1436343 | 010001101100 |
| 1036343 | 000101101100 |
| 1474343 | 010110001100 |
| 1474143 | 010110100100 |
| 1476303 | 010100101001 |
| 1436303 | 010001101001 |
| 1036303 | 000101101001 |
| 1474303 | 010110001001 |
| 1474103 | 010110100001 |

FIG. 12

Table 2, start point: state 1, end point: state 5

| | |
|---|---|
| 1478785 | 010111001110 |
| 1458785 | 011101001110 |
| 1258785 | 110101001110 |
| 1476785 | 010100111110 |
| 1436785 | 010001111110 |
| 1036785 | 000101111110 |
| 1474785 | 010110011110 |
| 1454785 | 011100011110 |
| 1254785 | 110100011110 |
| 1434785 | 010011011110 |
| 1034785 | 000111011110 |
| 1414785 | 011001011110 |
| 1214785 | 110001011110 |
| 1014785 | 001101011110 |
| 1478585 | 010111100110 |
| 1458585 | 011101100110 |
| 1258585 | 110101100110 |
| 1474585 | 010110110110 |
| 1454585 | 011100110110 |
| 1254585 | 110100110110 |
| 1434585 | 010011110110 |
| 1034585 | 000111110110 |
| 1414585 | 011001110110 |
| 1214585 | 110001110110 |
| 1014585 | 001101110110 |
| 1452585 | 011110010110 |
| 1252585 | 110110010110 |
| 1412585 | 011011010110 |
| 1212585 | 110011010110 |
| 1012585 | 001111010110 |
| 1478745 | 010111001011 |
| 1458745 | 011101001011 |
| 1258745 | 110101001011 |
| 1476745 | 010100111011 |
| 1436745 | 010001111011 |
| 1036745 | 000101111011 |
| 1474745 | 010110011011 |
| 1454745 | 011100011011 |
| 1254745 | 110100011011 |
| 1434745 | 010011011011 |
| 1034745 | 000111011011 |
| 1414745 | 011001011011 |
| 1214745 | 110001011011 |
| 1014745 | 001101011011 |
| 1478545 | 010111100011 |
| 1458545 | 011101100011 |
| 1258545 | 110101100011 |
| 1474545 | 010110110011 |
| 1476345 | 010100101111 |
| 1436345 | 010001101111 |
| 1036345 | 000101101111 |
| 1474345 | 010110001111 |
| 1474145 | 010110100111 |
| 1478525 | 010111101001 |
| 1458525 | 011101101001 |
| 1258525 | 110101101001 |
| 1474525 | 010110111001 |
| 1474125 | 010110101101 |

FIG. 13

Table 2, start point: state 1, end point: state 7

| | | |
|---|---|---|
| 1478787 010111001100 | 1014767 001101010011 | 1212547 110011010001 |
| 1458787 011101001100 | 1476367 010100100111 | 1012547 001111010001 |
| 1258787 110101001100 | 1436367 010001100111 | 1476347 010100101101 |
| 1476787 010100111100 | 1036367 000101100111 | 1436347 010001101101 |
| 1436787 010001111100 | 1474367 010110000111 | 1036347 000101101101 |
| 1036787 000101111100 | 1454367 011100000111 | 1474347 010110001101 |
| 1474787 010110011100 | 1254367 110100000111 | 1454347 011100001101 |
| 1454787 011100011100 | 1434367 010011000111 | 1254347 110100001101 |
| 1254787 110100011100 | 1034367 000111000111 | 1434347 010011001101 |
| 1434787 010011011100 | 1414367 011001000111 | 1034347 000111001101 |
| 1034787 000111011100 | 1214367 110001000111 | 1414347 011001001101 |
| 1414787 011001011100 | 1014367 001101000111 | 1214347 110001001101 |
| 1214787 110001011100 | 1430367 010010010111 | 1014347 001101001101 |
| 1014787 001101011100 | 1030367 000110010111 | 1430347 010010011101 |
| 1478587 010111100100 | 1410367 011000010111 | 1030347 000110011101 |
| 1458587 011101100100 | 1210367 110000010111 | 1410347 011000011101 |
| 1258587 110101100100 | 1010367 001100010111 | 1210347 110000011101 |
| 1474587 010110110100 | 1478747 010111001001 | 1010347 001100011101 |
| 1454587 011100110100 | 1458747 011101001001 | 1474147 010110100101 |
| 1254587 110100110100 | 1258747 110101001001 | 1454147 011100100101 |
| 1434587 010011110100 | 1476747 010100111001 | 1254147 110100100101 |
| 1034587 000111110100 | 1436747 010001111001 | 1434147 010011100101 |
| 1414587 011001110100 | 1036747 000101111001 | 1034147 000111100101 |
| 1214587 110001110100 | 1474747 010110011001 | 1414147 011001100101 |
| 1014587 001101110100 | 1454747 011100011001 | 1214147 110001100101 |
| 1452587 011110010100 | 1254747 110100011001 | 1014147 001101100101 |
| 1252587 110110010100 | 1434747 010011011001 | 1452147 011110000101 |
| 1412587 011011010100 | 1034747 000111011001 | 1252147 110110000101 |
| 1212587 110011010100 | 1414747 011001011001 | 1412147 011011000101 |
| 1012587 001111010100 | 1214747 110001011001 | 1212147 110011000101 |
| 1478767 010111000011 | 1014747 001101011001 | 1012147 001111000101 |
| 1458767 011101000011 | 1478547 010111100001 | 1430147 010010110101 |
| 1258767 110101000011 | 1458547 011101100001 | 1030147 000110110101 |
| 1476767 010100110011 | 1258547 110101100001 | 1410147 011000110101 |
| 1436767 010001110011 | 1474547 010110110001 | 1210147 110000110101 |
| 1036767 000101110011 | 1454547 011100110001 | 1010147 001100110101 |
| 1474767 010110010011 | 1254547 110100110001 | |
| 1454767 011100010011 | 1434547 010011110001 | |
| 1254767 110100010011 | 1034547 000111110001 | |
| 1434767 010011010011 | 1414547 011001110001 | |
| 1034767 000111010011 | 1214547 110001110001 | |
| 1414767 011001010011 | 1014547 001101110001 | |
| 1214767 110001010011 | 1452547 011110010001 | |
| | 1252547 110110010001 | |
| | 1412547 011011010001 | |

Eye-pattern of PR1+8/10 code

CODE MODULATION METHOD, CODE DEMODULATION METHOD, AND CODE DETECTION METHOD

BACKGROUND OF THE INVENTION

1. Field of the Invention

The present invention relates to a code modulation method, a code demodulation method and a code detection method for being suitably used in digitally recording, for example, audio data or video data to and playing back the data from a recording medium such as magnetic tape etc.

2. Description of Related Art

When video or audio data is digitally recorded on or played back from a disc such as a magnetic disc, an optical disc, or a magneto-optical disc etc. or magnetic tape, it is preferable that the data is, if possible, recorded at a high density. A partial response (1, 0, −1) or a partial response (1, 1) etc. is usually used for this purpose. High density recording is then possible by adopting a PRML (Partial Response with Maximum Likelihood) method that combines the partial response (1, 0, −1) or the partial response (1, 1) and Viterbi detection.

For example, with the partial response (1, 0, −1) (hereinafter abbreviated to PR4), when the free squared-Euclideam distance (hereinafter referred to as the free distance) during the conventional bit-by-bit detection method is taken to be 1, the free distance at the time of detection can be taken to be 2 via Viterbi detection. Signal to noise ratio (hereinafter referred to as S/N) can then be improved by having the value for the free distance large and the recording density can therefore be made correspondingly high. Further, with PR4, a free distance of 4 is possible during Viterbi detection, by the code modulation method.

However, it is necessary during playback that the modulation code does not include a D.C. component to make sure that, for example, errors due to variations in a reference level during binarization (digitization) of the playback signal do not occur or, for example, to ensure that fluctuations do not occur in each type of error signal such as tracking error signals etc. occurring in the so-called "servo control" of disc devices.

With the data symbols [1] and [0] being taken to be +1 and −1, the so-called DSV (Digital Sum Value), that is the sum total of the symbols from the time of starting the modulation code list, is a standard for evaluating the aforementioned D.C. component, with a small absolute value for DSV meaning that there is little D.C. component or low frequency component.

In modulation such as the 8–10 code adopted in digital audio tape recorders (DAT), the EFM (Eighteen to Fourteen Modulation) adopted in compact disc (CD) players and the Miller 2 (Miller squared) modulation adopted in magnetic disc devices, DSV control is exerted to make the absolute value for DSV small after, for example, NRZ (Non Return to Zero) present in so-called mark position modulation or NRZI (Non Return to Zero Inverted) present in mark length modulation is carried out.

With PR4, the characteristic of PR4 does not have a D.C. component and DSV control to make the absolute value of the DSV of the modulation code string small is therefore not needed. However, with the partial response (1, 1) (hereinafter abbreviated to PR1), the characteristic of PR1 does have a D.C. component and DSV control does have to be carried out for the modulation code list.

Further, the path memory length during Viterbi detection is a problem when adopting the PRML method. The path memory has a length proportional to the time interval until results are fixed at a storage device that pre-stores assumed detection values until the Viterbi detection results are decided. The time interval until the Viterbi detection results are decided i.e. the path memory length is controlled in accordance with the way of making the modulation code. For example, when applying 8–10 code to PR1, the maximum value of number of one continued in the modulation code string before NRZI modulation decides the necessary path memory length.

In reality, however, a device having an unlimited path memory is not possible, and a small path memory is necessary from the point of view of cost and the amount of occupied space. Control therefore has to be carried out with the aim of making the path memory length short for the modulation code string.

However, with the PR1, which has a small amount of spectrum in high-frequency region and is suited for having a high density when compared with the PR4, by using the improved 8–10 modulation code disclosed in the previous application of SN=08/309981 (Japanese Laid-Open Patent No. Hei 7-93906) by the same applicant, free distance during detection can be made to be 2 and the path memory can be made shorter while carrying out DSV control. But, the free distance at the time of detection while carrying out DSV control cannot be made larger than 2 even with this improved 8–10 conversion and the path memory length cannot be made further shorter.

SUMMARY OF THE INVENTION

As the present invention sets out to resolve these kinds of problems, it's object is to carry out DSV control with a PR1 while making free distance larger and path memory length shorter.

In order to achieve this object, a modulation method of converting m-bit data into n-bit code according to the present invention comprises a first step of receiving the m-bit data and a second step of outputting n-bit code corresponding to the m-bit data. The n-bit code is a code generated in accordance with a state transition diagram comprising P×Q states, where P and Q are positive integers. Further, the state transition diagram is provided with a space defined by a first axis and a second axis with the P×Q states being arranged therein, and has a code 00 being allotted upon a transition from a prescribed state to another state in a first direction along the first axis, a code 11 being allotted upon a transition from a prescribed state to another state in a second direction opposite to the first direction along the first axis, a code 01 being allotted upon a transition from a prescribed state to another state in a third direction along the second axis, and a code 10 being allotted upon a transition from a prescribed state to another state in a fourth direction opposite to the third direction along the second axis and the codes allotted to each of the transition are combined to construct the n-bit code.

It is preferable if P×Q is 3×3, n is 12 and m is 8.

Further, a code demodulation method of converting n-bit code into m-bit data according to the present invention comprises a first step of receiving the n-bit code and a second step of outputting m-bit data corresponding to the n-bit code. The n-bit code is a code generated in accordance with a state transition diagram comprising P×Q states, where P and Q are positive integers. Moreover, the state transition diagram is provided with a space defined by a first axis and a second axis with the P×Q states being arranged therein, and has a code 00 being allotted upon a transition from a prescribed state to another state in a first direction along the first axis, code 11 being allotted upon a transition from a prescribed state to another state in a second direction opposite to the first direction along the first axis, a code 01 being allotted upon a transition from a prescribed state to another state in a third direction along the second axis, and a code 10 being allotted upon a transition from a prescribed state to another state in a fourth direction opposite to the third direction along the second axis, and the respective codes allotted to each of the transition are combined to construct the n-bit code.

Moreover, a code detection method according to the present invention comprises a first step of receiving n-bit code being transmitted, the n-bit code being code generated in accordance with a state transition diagram comprising P×Q states, where P and Q are positive integers, the state transition diagram being provided with a space defined by a first axis and a second axis with the P×Q states being arranged therein, and having a code 00 being allotted upon a transition from a prescribed state to another state in a first direction along the first axis, a code 11 being allotted upon a transition from a prescribed state to another state in a second direction opposite to the first direction along the first axis, a code 01 being allotted upon a transition from a prescribed state to another state in a third direction along the second axis, and a code 10 being allotted upon a transition from a prescribed state to another state in a fourth direction opposite to the third direction along the second axis, and the codes allotted to each of the transitions being combined to construct the n-bit code, a second step of giving intersymbol interference to the received n-bit code using the partial response (1, 1) characteristic, and a third step of detecting the n-bit code to which the intersymbol interference is given in the second step using Viterbi detection. In the third step, the Viterbi detection is carried out in accordance with a state transition diagram comprising 2×Q states, and the 2×Q demodulation states are arranged in the state transition diagram along a third and fourth axis. In the third step, a code 00 is outputted when 0–1 is inputted upon a transition from a prescribed state to another state in a fifth direction along the third axis, a code 11 is outputted when 0+1 is inputted upon a transition from a prescribed state to another state in a sixth direction opposite to the fifth direction along the third axis, a code 01 is outputted when 00 is inputted upon a transition from a prescribed state to another state in a seventh direction along the fourth axis, a code 10 is outputted when 00 is inputted upon a transition from a prescribed state to another state in an eighth direction opposite to the seventh direction along the fourth axis, a code 10 is outputted when 10 is inputted upon a transition from a prescribed state to another state in a ninth direction along a fifth axis intersecting the fourth and third axes, a code 01 is outputted when −10 is inputted upon a transition from a prescribed state to another state along a tenth direction opposite to the ninth direction along the fifth axis, 00 is outputted when −1−1 is inputted upon a transition from a state arranged along the fourth axis at the end of the fifth direction to the same state, and 11 is outputted when 11 is inputted upon a transition from a state arranged along the fourth axis at the end of the sixth direction of the states arranged in a pair with respect to the fifth and sixth directions to the same state.

BRIEF DESCRIPTION OF THE DRAWINGS

FIG. 6 is a table showing an example of code generated to correspond to the state transition diagram in FIG. 4;

FIG. 7 is a table showing another example of code generated to correspond to the state transition diagram in FIG. 4;

FIG. 8 is a table showing a further example of code generated to correspond to the state transition diagram in FIG. 4;

FIG. 9 is a table showing a still further example of code generated to correspond to the state transition diagram in FIG. 4;

FIG. 10 is a table showing examples of code obtained by adding prescribed conditions when code is generated in accordance with the state transition diagram in FIG. 4;

FIG. 11 is a table showing other examples of code obtained by adding prescribed conditions when code is generated in accordance with the state transition diagram in FIG. 4;

FIG. 12 is a table showing further examples of code obtained by adding prescribed conditions when code is generated in accordance with the state transition diagram in FIG. 4;

FIG. 13 is a table showing still further examples of code obtained by adding prescribed conditions when code is generated in accordance with the state transition diagram in FIG. 4;

DETAILED DESCRIPTION OF THE PREFERRED EMBODIMENT

Figure 1:
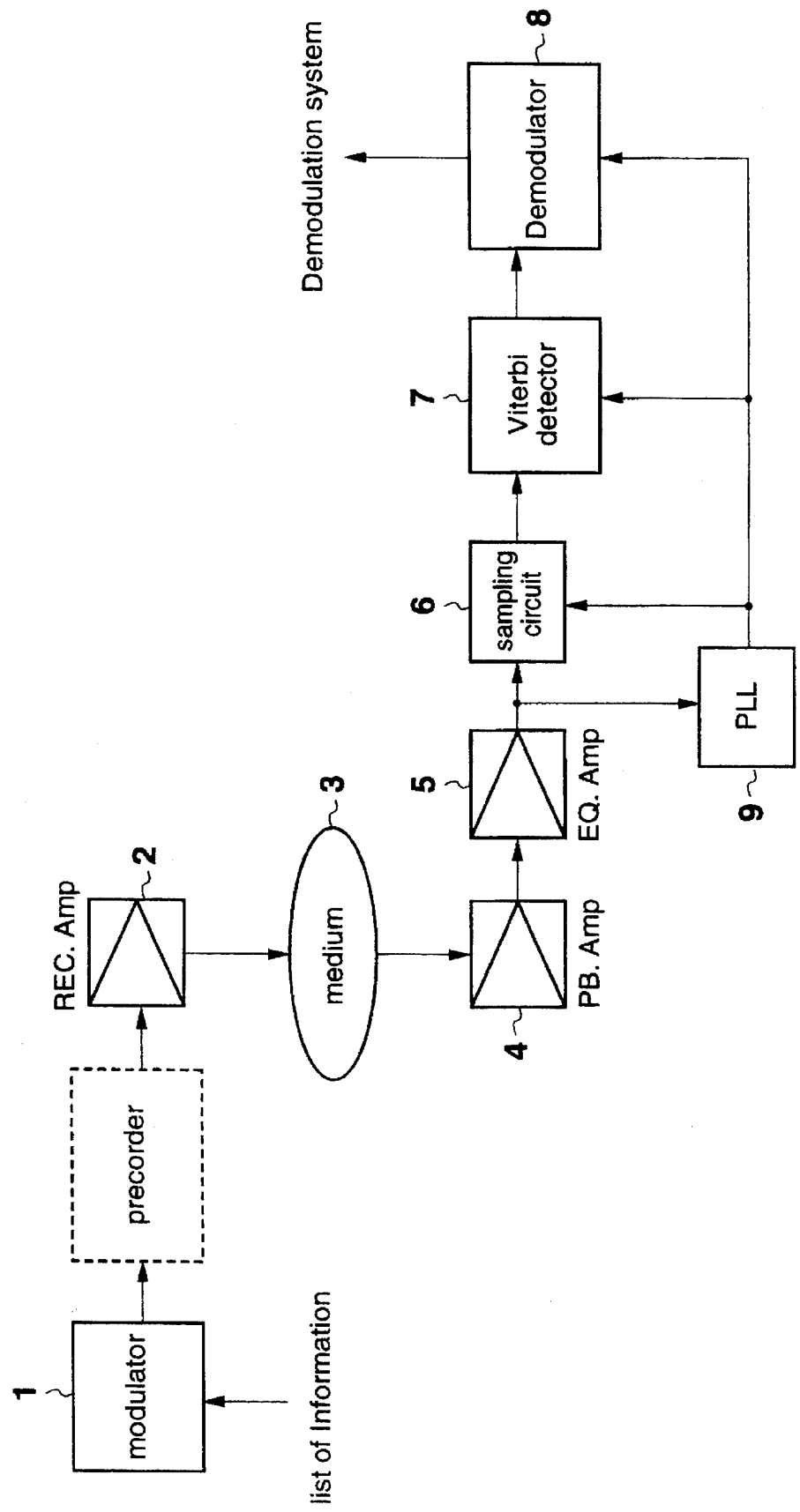
FIG. 1 is a block diagram showing an embodiment of a recording/playback device to which the code modulation method and the code demodulation method of the present invention are applied.

FIG. 1 is a block diagram showing an embodiment of a recording/playback device to which the code modulation method and code demodulation method of the present invention is applied.

Figure 2:
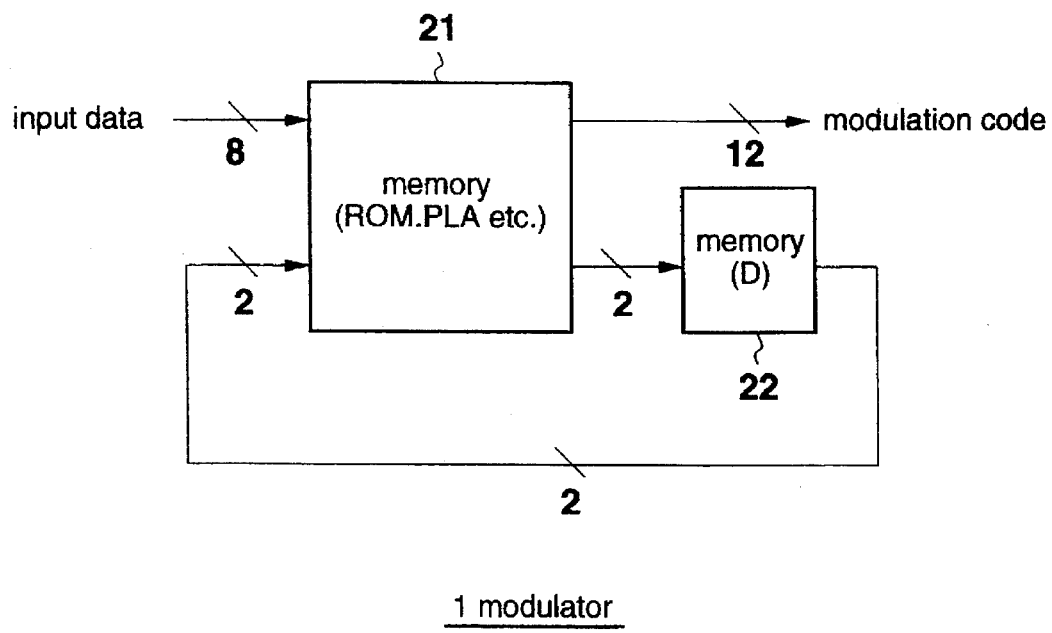
FIG. 2 is a block diagram showing an example of the modulator 1 in FIG. 1.

A list of information (digital data) to be recorded on a medium 3 such as an optical disc, magneto-optical disc or magnetic disc etc. is inputted at a modulator 1. This modulator 1, as exemplified in FIG. 2, is constructed from a memory 21 comprised of a ROM (Read Only Memory) or a PLA (Programmable Logic Array) etc. and a memory 22 comprised of a register etc.

Then, m-bit (for example, 8 bit) digital data inputted to the modulator 1 is converted to n-bit (for example, 12 bit) digital data and outputted to a recording amplifier 2. The recording amplifier 2 amplifies and records on a medium 3 the inputted data.

Data recorded at the medium 3 is played back, inputted to an equalizing amplifier 5 via the playback amplifier 4, and, after being equalized, inputted to a sampling circuit 6 and a PLL circuit 9. The sampling circuit 6 samples the inputted playback signal from the medium 3 and outputs the sampled values to a Viterbi detetor 7. The Viterbi detector 7 decodes the sampled values inputted by the sampling circuit 6 and provides the detected results to a demodulator 8. The PLL circuit 9 generates a clock signal from the playback signal inputted by the equalizing amplifier 5 and outputs the clock signal to the sampling circuit 6, Viterbi detector 7 and the demodulator 8.

Figure 3:
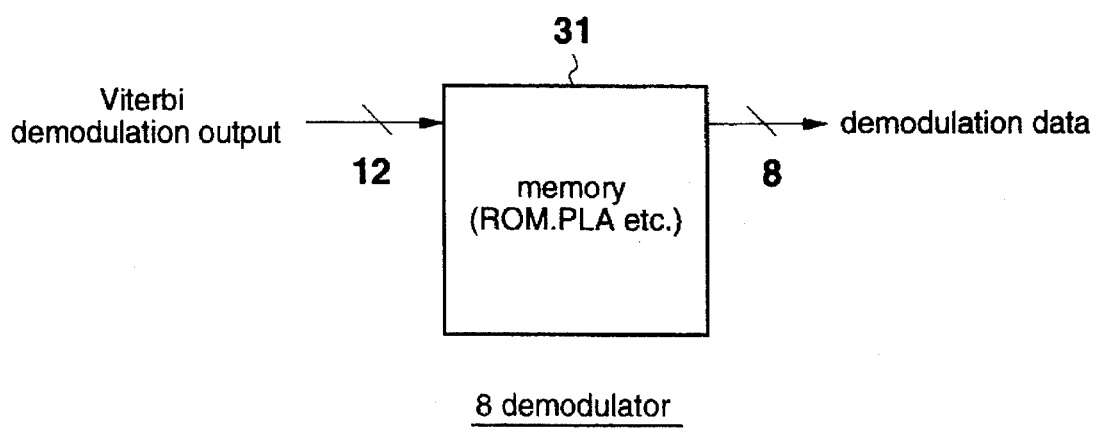
FIG. 3 is a block diagram showing an example of the demodulator 8 of FIG. 1.

The demodulator 8 is constructed from a memory 31 comprising a ROM or a PLA etc., as exemplified in FIG. 3.

A precoder is not provided on the recording side in this embodiment.

Next, the operation will be described. The 8 bit data inputted to the memory 21 of the modulator 1 is converted to 12 bit data in accordance with the conversion table recorded in the memory 21. This conversion table (the details of which are described later with reference to FIG. 10 to FIG. 13) is created in accordance with the state transition diagram shown in FIG. 4. Note that the states in FIG. 4 bear no relationship to the states in FIG. 14 to be described later.

Figure 4:
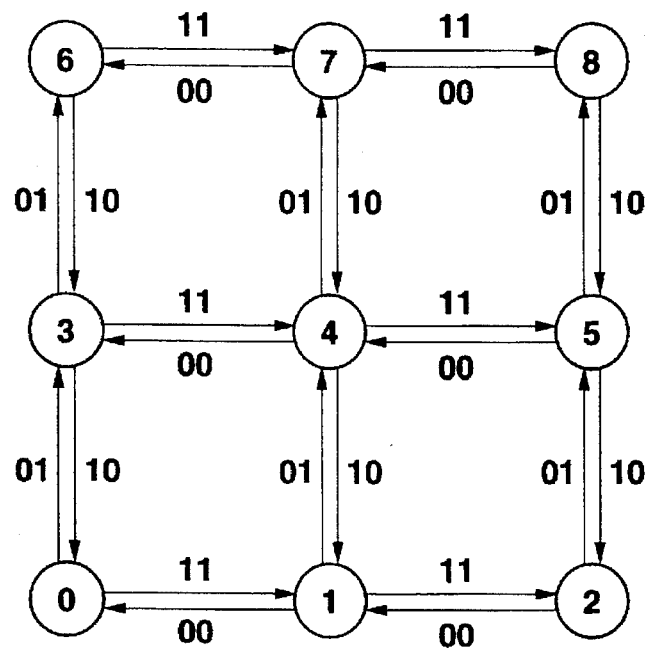
FIG. 4 is a diagram showing transition states for code generation.

In this embodiment, as shown in FIG. 4, the 3×3 states of from state 0 to state 8 are arranged in a matrix. Then, of each of the transitions of the states along the horizontal axis, 2 bits data 11 are allotted to the rightward transitions, and two bits data 00 are allotted to the leftward transitions. Then, of the transitions of the states along the vertical axis, two bits data 01 are allotted to the upward transitions and two bits data 10 are allotted to the downward transitions.

In FIG. 4, the horizontal direction is the direction that controls the DC component during coding. This horizontal direction is unrelated to the Viterbi detection to be described later. The vertical direction is then the direction for controlling the energy of the frequency component of half of the recording rate existing in the code. This vertical direction is closely related to the Viterbi detection and decides the free distance of the code.

The start point and end point of the transitions of the 9 states may be taken as any of the odd numbered states 1, 3, 5 or 7. This is because coding is easier in taking odd-numbered states as the start points than in taking even-numbered-states as the start points.

Therefore, the transition operation which takes any one of the states 1, 3, 5 or 7 as the start point and then again takes any one of the states 1, 3, 5 or 7 as the end point after the transitions through the other 5 states generates 12 bit data corresponding to each of the transitions which is taken as data to be stored in the memory 21.

For example, if transitions are made through state 1, 4, 7, 8, 7, 4 and 1, the 12 bit data 01, 01, 11, 00, 10 and 10 is generated. Further, if transitions are made through the path of state 1, 0, 3, 6, 7, 4 and 1, the 12 bit data 00, 01, 01, 11, 10 and 10 is obtained. Also, if transitions are made through 1, 0, 3, 4, 5, 8 and 7, the 12 bit data 00, 01, 11, 11, 01 and 00 is obtained.

Twelve bit data corresponding to transitions from a prescribed start point through another 5 states to an end point can then be used as code after conversion.

Twelve bit data generated in this way can all be used as code after conversion when the Viterbi detector 7 has an infinite path memory. However, in reality, an infinite path memory cannot be provided. It is therefore preferable from the point of view of cost and occupied space, to keep the smallest possible memory length.

Figure 5:
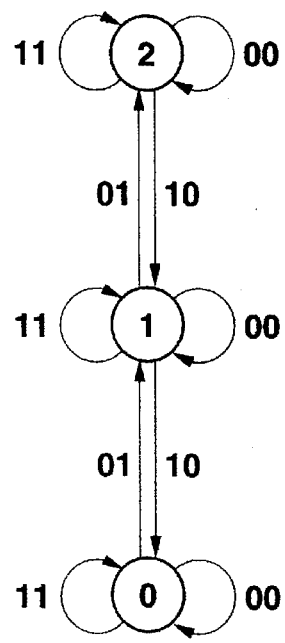
FIG. 5 is a diagram showing state transitions when the limitations of the horizontal axis in FIG. 4 are removed.

Consider, the transition states exemplified in FIG. 5, which is a state transition diagram expressing FIG. 4 using only the states that can be used in deciding the free distance. The reason why it is preferable just to consider the vertical transitions in FIG. 4 in the way shown in FIG. 5 is because horizontal transitions in FIG. 4 are unrelated to the path memory length and the case of Viterbi detection with PR(1, 1). Here, consider codes for which a path departing from state 0 only makes a transition across to state 1 and a path leaving from state 1 only makes a transition across to state 2. Further, regarding these codes, if we assume that when one path makes a transition to one more upper state, the other path is also taken to make a transition to one more upper state, and when the one path remains in the same state, the other path also remains in the same, the two paths never meet. It is therefore impossible for the paths to be merged. This implies that an infinite path memory is necessary.

The condition for making the path memory finite is to make state 0 and state 2 to be always passed through once. A shorter interval between state 0 and state 2 being passed through will mean that memory length will also become shorter.

The horizontal axis of FIG. 4 shows the DSV (Digital Sum Value). i.e. code 0 corresponds to −1 and code 1 is allotted to +1 and the sum of +1 and −1 allotted to the generated code is calculated. For example, in a transition from state 1 to state 0 with subsequent returning from state 0 to state 1, the code for the transition from state 1 to state 0 is 00, so the DSV becomes −2(=−1+−1). However, returning from state 0 to state 1, the coding is 11 and the DSV becomes 2(=1+1), giving a total DSV of 0(=−2+2). The code is also 11 when a transition is made from state 1 to state 2, so that the DSV becomes 2. The DSV when returning from the state 2 to state 1 becomes −2, the DSV at the time when the transition returns to state 1 therefore becomes 0.

In a transition from state 1 to state 0 followed by a further transition from state 0 to state 3, the code at the time of the transition from state 1 to state 0 is 00, for which the DSV is therefore −2, and the code at the time of the transition from state 0 to state 3 is 01, for which DSV is therefore 0(=+1−1). The DSV at the time of the transition to state 3 is therefore −2.

When there are these kinds of transitions in states along the vertical axis, the codes allotted to these transitions are 01 or 10, and the DSV is therefore 0. The DSV therefore does not change even if there is a transition in state along the vertical direction. In other words, the DSV only changes for transitions in the direction of the horizontal axis and states along the same vertical line have the same DSV.

In this embodiment, the maximum value and minimum value of the DSV are −3 and +3, which are generated during transitions.

That is, when there is a transition from state 1 to state 0, the DSV becomes −2. When there is a further transition from state 0 to state 3, the DSV becomes −3 at the time when the −1 corresponding to the code 0 of the code 01 is added. However, when the state reaches state 3, +1 corresponding to the 1 of the code 01 is added as the DSV and the value of the DSV eventually becomes −2 as described above.

Further, in a transition from state 7 to state 5 through state 8, the DSV becomes 2(=+1+1) so as to correspond to the code 11 at the time of the transition from state 7 to state 8. The DSV also temporarily becomes 3 because +1 corresponding to the code 1 of the code 10 is added at the time of the further transition from state 8 to state 5. Finally, −1 corresponding to the remaining code 0 is added and the DSV eventually becomes 2.

The generation of a direct current component for the code can be prevented by making the number of states for the horizontal direction of FIG. 4 finite. That is, the generation of a direct current component is prevented by making the generating frequency of 00 and/or 11 equal.

The energy of the frequency component of half of the channel rate fch (transmission rate) can be made to be zero by making the number of states in the vertical direction finite. In other words, the free distance at the time of detection is made large and resistance to noise is enhanced by making the frequency of generation of 01 and 10 equal.

FIG. 6 to FIG. 9 show specific examples of code that can be generated in accordance with the state transition diagram of FIG. 4. FIG. 6 shows the case when the start point is state 1 and the end point is state 1, FIG. 7 shows the case when the start point is state 1 and the end point is state 3, FIG. 8 shows the case when the start point is state 1 and the end point is state 5, and FIG. 9 shows the case when the start point is state 1 and the end point is state 7.

The 12 bit codes generated in the above way in accordance with the state transition diagram of FIG. 4 may be used as conversion code. However, by making selections from these codes that satisfy the following conditions, the length (truncation depth) which is capable of merging the paths an be made to be within three code lengths (36 bits).

These conditions are as follows;

(1) Codes having a start point of state 1 and an end point of state 1 are selected from those passing through any of states 6, 7 or 8.
(2) Codes having a start point of state 1 and an end point of state 3 are selected from those passing through any of states 6, 7 or 8.
(3) Codes having a start point of state 1 and an end point of state 5 are selected from those passing through any of states 6, 7 or 8.
(4) Codes having a start point of state 1 and an end point of state 7 are selected from those passing through arbitrary states.
(5) Codes having a start point of state 3 and an end point of state 1 are selected from those passing through, any of states 6, 7 are selected from or 8.
(6) Codes having a start point of state 3 and an end point of state 3 are selected from those passing through any of states 0, 1 or 2, as well as any of states 6, 7 or 8.
(7) Codes having a start point of state 3 and an end point of state 5 are selected from those passing through any of states 6, 7 or 8.
(8) Codes having a start point of state 3 and an end point of state 7 are selected from those passing through arbitrary states.
(9) Codes having a start point of state 5 and an end point of state 1 are selected from those passing through arbitrary states.
(10) Codes having a start point of state 5 and an end point of state 3 are selected from those passing through any of states 0, 1 or 2.
(11) Codes having a start point of state 5 and an end point of state 5 are selected from those passing through any of states 0, 1 or 2, as well as any of states 6, 7 or 8.
(12) Codes having a start point of state 5 and an end point of state 7 are selected from those passing through any of states 0, 1 or 2.
(13) Codes having a start point of state 7 and an end point of state 1 are selected from those passing through arbitrary states.
(14) Codes having a start point of state 7 and an end point of state 3 are selected from those passing through any of states 0, 1 or 2.
(15) Codes having a start point of state 7 and an end point of state 5 are selected from those passing through any of states 0, 1 or 2.
(16) Codes having a start point of state 7 and an end point of state 7 are selected from those passing through any of states 0, 1 or 2.

Or as follows;

(1') Codes having a start point of state 1 and an end point of state 1 are selected from those passing through any of states 6, 7 or 8.
(2') Codes having a start point of state 1 and an end point of state 3 are selected from those passing through any of states 6, 7 or 8.
(3') Codes having a start point of state 1 and an end point of state 5 are selected from those passing through any of states 6, 7 or 8.
(4') Codes having a start point of state 1 and an end point of state 7 are selected from those passing through arbitrary states.
(5') Codes having a start point of state 3 and an end point of state 1 are selected from those passing through arbitrary states.
(6') Codes having a start point of state 3 and an end point of state 3 are selected from those passing through any of states 0, 1 or 2, as well as any of states 6, 7 or 8.
(7') Codes having a start point of state 3 and an end point of state 5 are selected from those passing through any of states 6, 7 or 8.
(8') Codes having a start point of state 3 and an end point of state 7 are selected from those passing through any of states 0, 1 or 2.
(9') Codes having a start point of state 5 and an end point of state 1 are selected from those passing through any of states 6, 7 or 8.
(10') Codes having a start point of state 5 and an end point of state 3 are selected from those passing through any of states 0, 1 or 2.
(11') Codes having a start point of state 5 and an end point of state 5 are selected from those passing through any of states 0, 1 or 2, as well as any of states 6, 7 or 8.
(12') Codes having a start point of state 5 and an end point of state 7 are selected from those passing through arbitrary states.
(13') Codes having a start point of state 7 and an end point of state 1 are selected from those passing through arbitrary states.
(14') Codes having a start point of state 7 and an end point of state 3 are selected from those passing through any of states 0, 1 or 2.
(15') Codes having a start point of state 7 and an end point of state 5 are selected from those passing through any of states 0, 1 or 2.
(16') Codes having a start point of state 7 and an end point of state 7 are selected from those passing through any of states 0, 1 or 2.

By setting these kind of conditions, 273 codes having the state 1 as a start point, 297 codes having state 3 as a start point, 297 codes having the state 5 as a start point, and 273 codes having the state 7 as a start point can be obtained. Therefore, by selecting 256 codes for each state as a start point, and making them in correspondence to each of 8 bits input data, they can be made to be the codes for being able to merge the paths within 36 bits.

For example, code obtained by adding the aforementioned conditions (1) to (16) are as shown in FIG. 10 to FIG. 13. FIG. 10 shows the case where the start point is state 1 and the end point is state 1 (i.e. a part of the code in FIG. 6), FIG.

11 shows the case where the start point is state 1 and the end point is state 3 (a part of the code of FIG. 7), FIG. 12 shows the case where the start point is state 1 and the end point is state 5 (a part of the code of FIG. 8) and FIG. 13 shows the case where the start point is state 1 and the end point is state 7 (a part of the code of FIG. 9). As described above, paths may be merged within 36 bits by using the codes shown in FIG. 10 to FIG. 13.

The code generated in accordance with the state transition diagram in FIG. 4 has a doubled free distance during Viterbi detection compared with the case without being coded.

Further, when the code is considered as RLL (d,k) code, the minimum number d of permitted successive zero's is 0 and the maximum number k of permitted successive zero's is "5".

Twelve bit code generated in the above way is then stored in the memory 21. When 8-bit data is inputted to the memory 21, 12-bit data corresponding to this 8-bit data is read-out as modulation code and outputted to the recording amplifier 2.

The memory 22 stores one of the state of state 1, state 3, state 5 and state 7 that becomes the end point when the immediately previous 12 bit code is generated. This end point then made to be the start point of transition for generating the next 12 bit code. In this way, successive transitions of the states are carried out. Because of this, four types of code (codes for which the start points are states 1, 3, 5 and 7, respectively) are provided at the memory 21 for one 8-bit code and types of code corresponding to the end point of the immediately previous code are selected.

In the above way, 12 bit data converted in accordance with the table stored in the memory 21 is provided to the medium 3 via the recording amplifier 2 and recorded.

Meanwhile, data recorded on the medium 3 is played back, then amplified by the playback amplifier 4 and then equalized by the equalizing amplifier 5 before being provided to the sampling circuit 6 and the PLL circuit 9. The operations in the playback amplifier 4, equalization amplifier 5 and the sampling circuit 6 give an equivalent intersymbol interference, which is due to the partial response (1, 1) characteristic, to the data (an n-bit data string obtained by modulation) played back from the media.

The PLL circuit 9 generates a clock from the inputted data and provides the generated clock to the sampling circuit 6, the Viterbi detector 7 and the demodulator 8.

The sampling circuit 6 samples a ternary signal inputted by the equalizing amplifier 5 in synchronious with a clock inputted by the PLL circuit 9. The data obtained by the sampling is then inputted to the Viterbi detector 7 and detected binary data.

Figure 14:
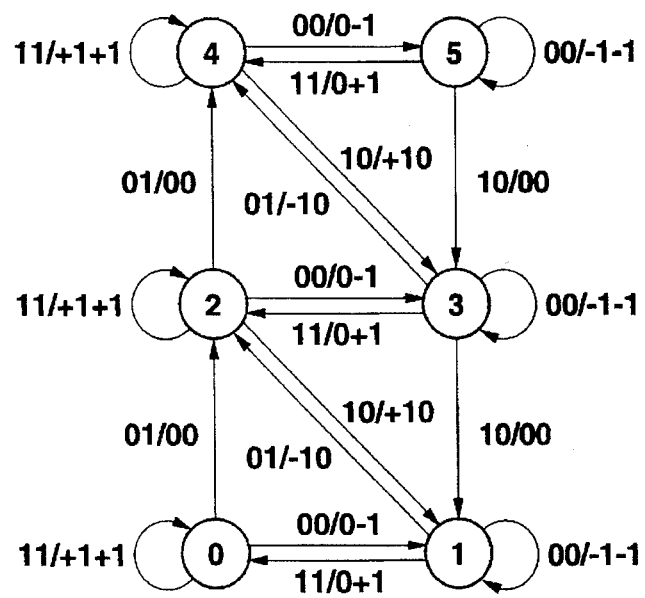
FIG. 14 is a diagram showing state transitions for Viterbi detections.

FIG. 14 shows state transitions during Viterbi detection at the Viterbi detector 7. In other words, this state transition diagram is for obtaining a probable detected value using Viterbi detection while considering PR(1, 1) intersymbol interference. The states of FIG. 14 are the states during Viterbi detection and differ from the states during the code generation of FIG. 4.

As shown in FIG. 14, in this embodiment, 2×3 states (detection states) are arranged in a matrix on a plane defined by a horizontal axis and a vertical axis. The reason of being 2×3 states is because there are three states in the vertical direction in FIG. 4 and PR(1, 1) is used as the intersymbol interference makes a bit in one state previous influence the current bit. FIG. 14 is a diagram based on FIG. 5.

In FIG. 14, in the case where 0−1(the input of 0 and −1 will be abbreviated hereafter in this way) is inputted as sampling data during state transitions in the right direction along the horizontal axis, a code 00 is outputted. Conversely, when sampling data 0+1 is inputted in transitions in the left direction, a code 11 is outputted.

Further, when a sampling value 00 is inputted corresponding to an upward transition along the vertical axis, a code 01 is outputted. Conversely, when a sampling value 00 is inputted corresponding to a downward transition, a code 10 is outputted.

In the case of a transition along an axis going in a diagonal direction crossing the horizontal axis and the vertical axis (for example, a transition between the state 1 and the state 2, or a transition between the state 3 and the state 4), when a +10 sampling value corresponding to a transition in the right-lower direction (a transition to a lower number) is inputted, the code 10 is outputted. Conversely, when a sampling value −01 corresponding to a transition in the left-upper direction (a transition to a higher numbered state) is inputted, the code 01 is outputted.

Moreover, in FIG. 14, in the states on the left side (state 0, state 2 and state 4) of the states arranged in a pair of the left and right states, when a sampling value 11 is inputted corresponding to a transition back to the same state, a code 11 is outputted. Further, in the states on the right side (state 1, state 3 and state 5), when a sampling value −1 −1 is inputted corresponding to a transition returning to the same state, the code 00 is outputted.

Figure 15:
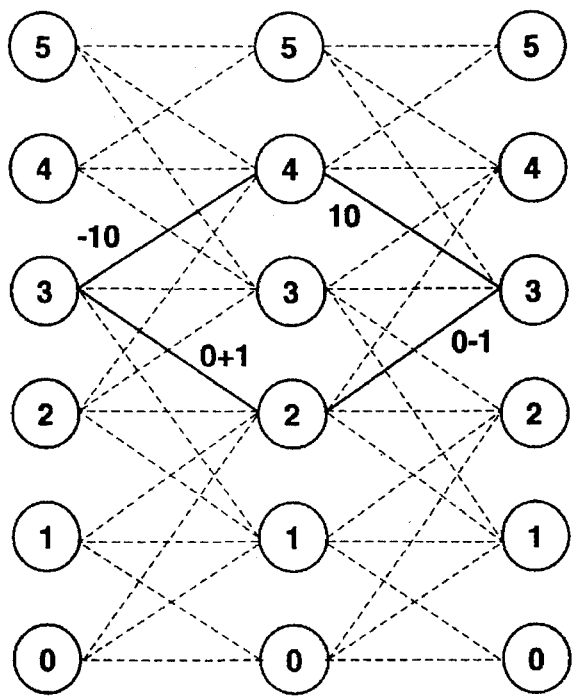
FIG. 15 is a Trellis structure corresponding to the state transitions in FIG. 6.

FIG. 15 shows a Trellis structure corresponding to FIG. 14. For example, in the case of the transitions from state 3 to state 4 and then from state 4 to state 3 as shown by the upper solid lines in FIG. 15, a path comprised of the sampling values −1, −0, +1, 0 is obtained. Meanwhile, in the case where the transition is obtained in the path from state 3 to state 2, and further to state 3 as shown by the solid line of the lower side of FIG. 15, the sampling value 0, +1, 0, −1 is obtained.

Obtaining the free distance for the two paths, the distance between the first bit −1 of the upper path and the first bit 0 of the lower path is 1, the distance between the second bit 0 of the upper path and the second bit +1 of the lower path is 1, the distance between the third bit 1 of the upper path and the third bit 0 of the lower path is 1 and the distance between the fourth bit 0 of the upper path and the fourth bit −1 of the lower path is 1. The free distance therefore eventually becomes 4(=1+1+1+1). Numerous other combinations also exist but the free distance does not become smaller than 4.

Figure 16:
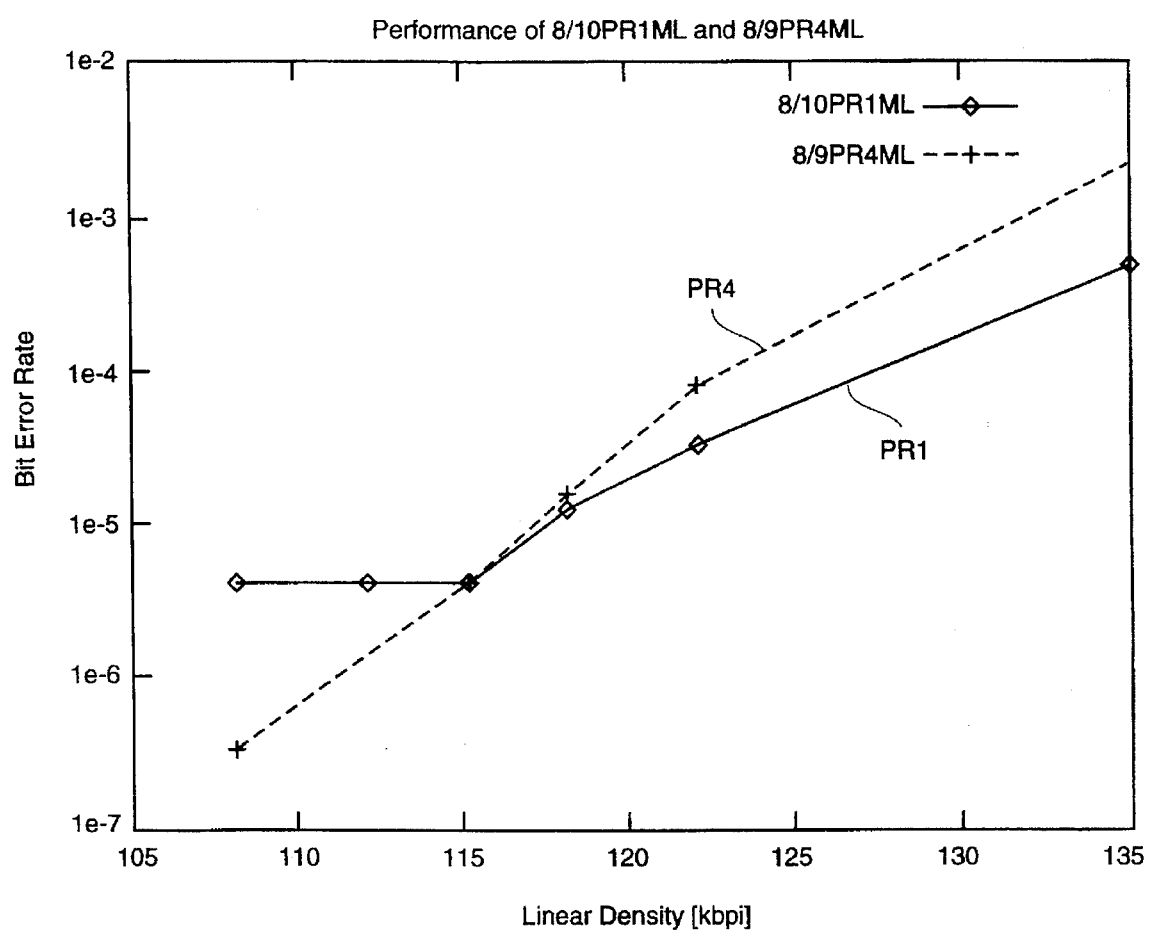
FIG. 16 is a graph showing the characteristics of the bit error rate for PR1 and PR4.

The S/N ratio can therefore be best improved in the case where code generated in accordance with the state transition diagram of FIG. 4 is applied to the PR1 shown in FIG. 14 and Viterbi detection is carried out. FIG. 16 shows bit error simulation results after Viterbi detections of the combinations of PR4 with 8–9 codes and the PR1 with 8–10 codes. It can be seen from FIG. 16 that the combination with PR1 provides smaller bit error rate when the linear density becomes 115 kbpi or greater.

Figure 17:
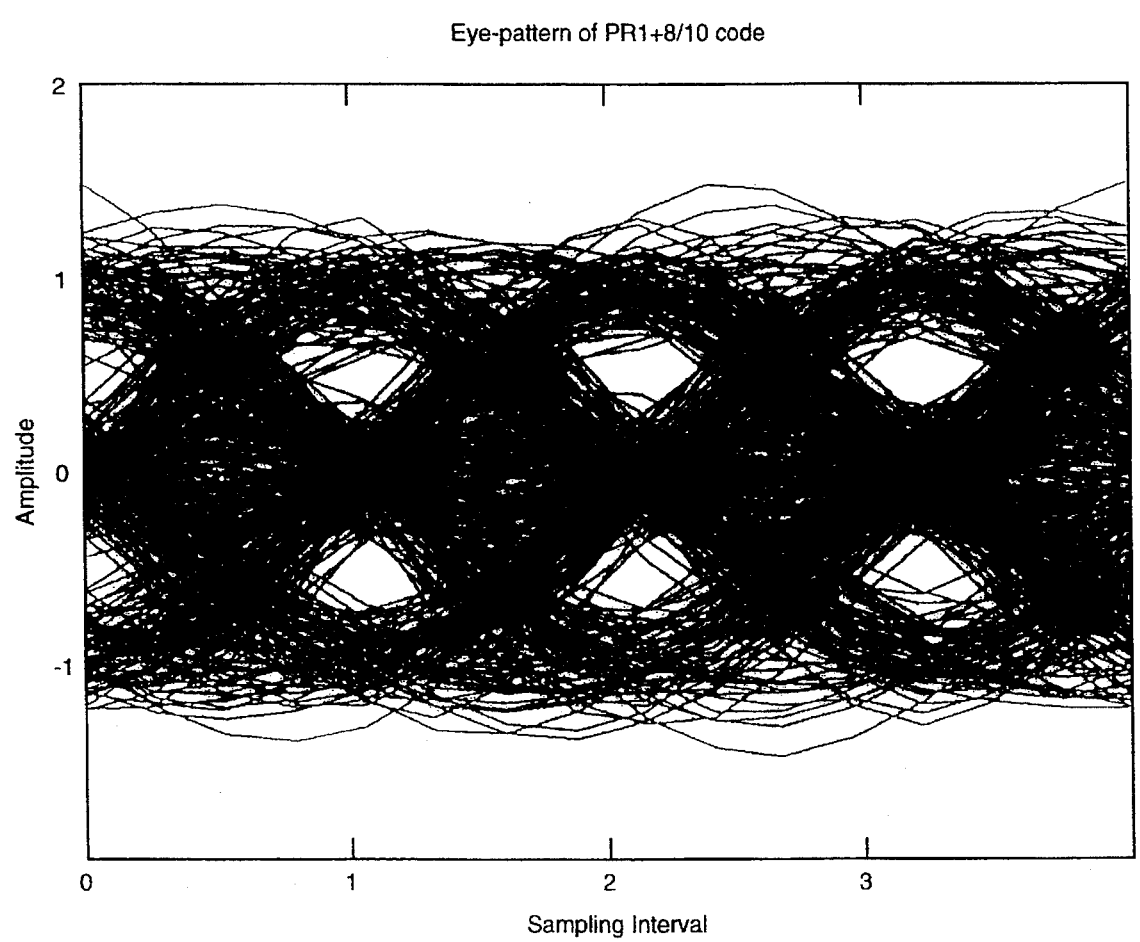
FIG. 17 is a diagram showing the eye pattern for PR1.
Figure 18:
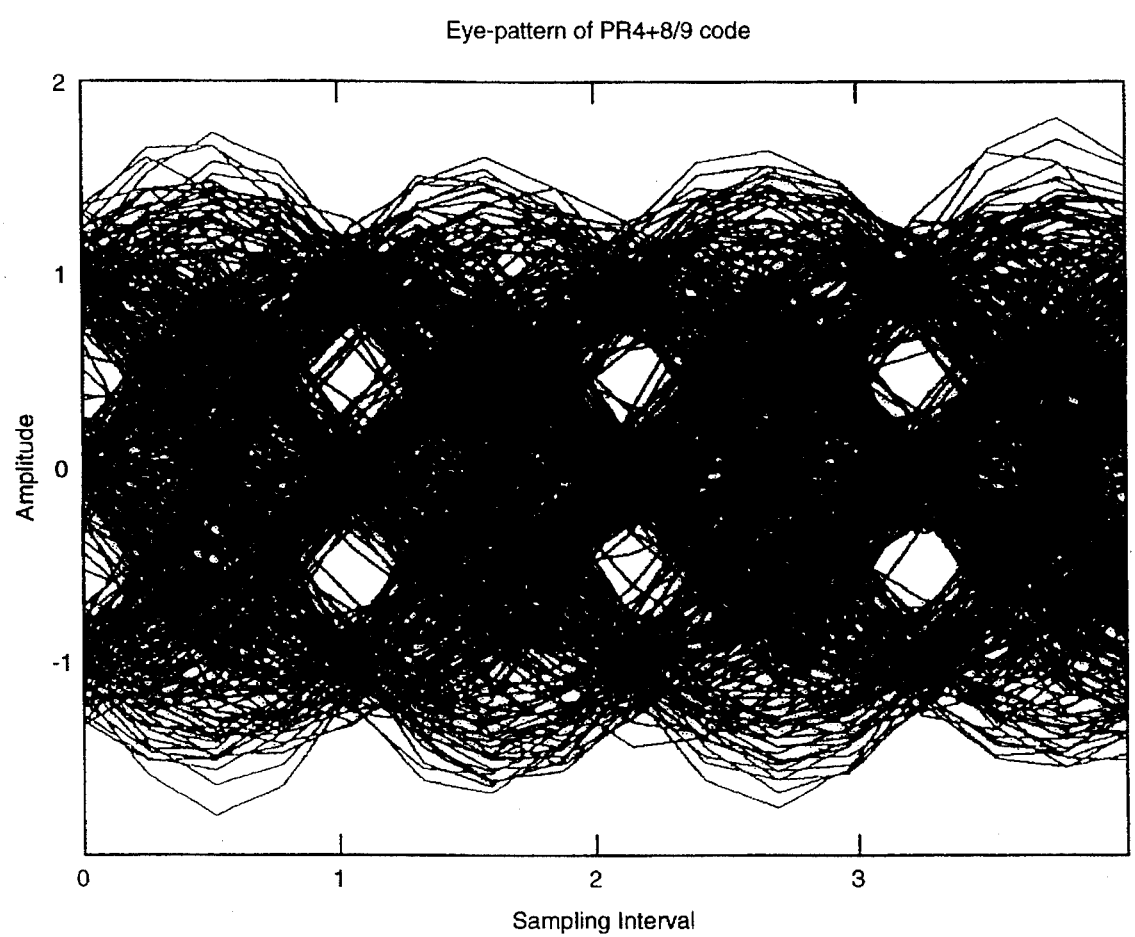
FIG. 18 is a diagram showing the eye pattern for PR4.

FIG. 17 shows the eye pattern in the case of combination with PR1, and FIG. 18 shows the eye pattern in the case of combination with PR4. As becomes clear from comparing these two drawings, the eye pattern shown in FIG. 17 has larger openings which means a greater resistance to noise is provided.

Thus, PR1 provides a better S/N ratio than PR4, and can be said to be a method suitable for being highly densified.

Therefore, code for use with PR1 generated in accordance with the state transition diagram shown in FIG. 4 performs better than code of free distance 4 for use with the already known PR4.

Data with binary code 0 or 1 being decoded from ternary code −1, 0, +1 by the Viterbi detector 7 is inputted to the memory 31 of the demodulator 8. The memory 31 stores code having a complementary relationship with that stored in the memory 21 of FIG. 2 and, when 12 bit code is then inputted to the memory 31, corresponding 8-bit data is read-out and then outputted as a demodulated output.

In the above embodiment, 8–12 code is generated in accordance with the state transition diagram shown in FIG. 4, but, for example, generation of 8–14 code is also possible.

In the embodiment of FIG. 4, a state transition diagram was formed with 3×3 states, but using a greater number of states is also possible to form a transition diagram as being exemplified to have 4×4 states for generating 16–20 code.

According to the code modulation method of the present invention, in the case of a transition from a prescribed state to another state amongst the P×Q finite states, 00 and 11 are allotted along the first axis and 01 and 10 are allotted along the second axis so that m-bit code is converted to n-bit code. Therefore, when the generated codes is combined with PR1, the free distance during Viterbi detection can be made larger while performing DSV control and high density recording becomes possible.

Further, according to the code demodulation method of the present invention, when 00 and 11 are allotted along the first axis and 01 and 10 are allotted along the second axis for transitions from a prescribed state to another state amongst the 3×3 states, 8 bit code is converted to 12 bit code in such a manner as to pass through a state at one end and a state at the other end of the axis in the second direction in a prescribed number of state transitions. This therefore makes it possible to provide a device for which the path memory for the Viterbi detection device can be made short.

Further, according to the code detection method of the present invention, 2×3 states are arranged along a third and fourth axis and when prescribed inputs are given corresponding to transitions along each of the axis, a value corresponding to these inputs is outputted. The PR1 input may therefore be detected without failure irrespective of noise occurring on the transmission path.

What is claimed is:

1. A code modulation method of converting m-bit data into n-bit code, comprising:
    a first step of receiving the m-bit data; and
    a second step of outputting n-bit code corresponding to the m-bit data,
    the n-bit code being a code generated in accordance with a state transition diagram comprising P×Q states, where P and Q are positive integers,
    the state transition diagram being provided with a space defined by a first axis and a second axis with the P×Q states being arranged therein, and having
    a code 00 being allotted upon a transition from a prescribed state to another state in a first direction along the first axis,
    a code 11 being allotted upon a transition from a prescribed state to another state in a second direction opposite to the first direction along the first axis,
    a code 01 being allotted upon a transition from a prescribed state to another state in a third direction along the second axis, and
    a code 10 being allotted upon a transition from a prescribed state to another state in a fourth direction opposite to the third direction along the second axis, and
    the codes allotted to each of the transitions being combined to construct the n-bit code.

2. A code modulation method according to claim 1, wherein P×Q is 3×3.

3. A code modulation method according to claim 2, wherein n is 12 and m is 8.

4. A code modulation method according to claim 1,
    wherein of n-bit codes generated in accordance with the state transition diagram, an n-bit code generated by a transition taking the state positioned at the center of the end of the fourth direction as a start point, any of the state positioned at the end of the third direction as pass-through points, and the state positioned at the center of the end of the fourth direction as an end point, an n-bit code generated by a transition taking the state positioned at the center of the end of the fourth direction as a start point, any of the state positioned at the end of the third direction as pass-through points, and the state positioned at the center of the end of the first direction as an end point, an n-bit code generated by a transition taking the state positioned at the center of the end of the fourth direction as a start point, any of the state positioned at the end of the third direction as pass-through points, and the state positioned at the center of the end of the second direction as an end point, and an n-bit code generated by a transition taking the state positioned at the center of the end of the fourth direction as a start point and the state positioned at the center of the end of the third direction as an end point are allotted to the m-bit data,
    of n-bit codes generated in accordance with the state transition diagram, an n-bit code generated by a transition taking the state positioned at the center of the end of the third direction as a start point, any of the state positioned at the end of the fourth direction as pass-through points, and the state positioned at the center of the end of the third direction as an end point, an n-bit code generated by a transition taking the state positioned at the center of the end of the third direction as a start point, any of the state positioned at the end of the fourth direction as pass-through points, and the state positioned at the center of the end of the first direction as an end point, an n-bit code generated by a transition taking the state positioned at the center of the end of the third direction as a start point, any of the state positioned at the end of the fourth direction as pass-through points, and the state positioned at the center of the end of the second direction as an end point, and an n-bit code generated by a transition taking the state positioned at the center of the end of the third direction as a start point and the state positioned at the center of the end of the fourth direction as an end point are allotted to the m-bit data,
    of n-bit codes generated in accordance with the state transition diagram, an n-bit code generated by a transition taking the state positioned at the center of the end of the first direction as a start point, any of the state positioned at the end of the third direction as pass-through points, and the state positioned at the center of the end of the fourth direction as an end point, an n-bit code generated by a transition taking the state positioned at the center of the end of the first direction as a start point, both of any of the state positioned at the end of the third direction and any of the state positioned at the end of the fourth direction as pass-through points, and the state positioned at the center of the end of the first direction as an end point, an n-bit code generated by a transition taking the state positioned at the center of the end of the first direction as a start point, any of the state positioned at the end of the third direction as pass-through points, and the state positioned at the center of the end of the second direction as an end point, and an n-bit code generated by a transition taking the state positioned at the center of the end of the first direction as a start point and the state positioned at the center of the end of the third direction as an end point are allotted to the m-bit data, and of n-bit codes generated in accordance with the state transition diagram, an n-bit code generated by a transition taking the state positioned at the center of the end of the second direction as a start point, any of the state positioned at the end of the fourth direction as pass-through points, and the state positioned at the center of the end of the third direction as an end point, an n-bit code generated by a transition taking the state positioned at the center of the end of the second direction as a start point, both of any of the state positioned at the end of the fourth direction and any of the state positioned at the end of the third direction as pass-through points, and the state positioned at the center of the end of the second direction as an end point, an n-bit code generated by a transition taking the state positioned at the center of the end of the second direction as a start point, any of the state positioned at the end of the fourth direction as pass-through points, and the state positioned at the center of the end of the first direction as an end point, and an n-bit code generated by a transition taking the state positioned at the center of the end of the second direction as a start point and the state positioned at the center of the end of the fourth direction as an end point are allotted to the m-bit data.

5. A code modulation method according to claim 1, wherein of n-bit codes generated in accordance with the state transition diagram, an n-bit code generated by a transition taking the state positioned at the center of the end of the fourth direction as a start point, any of the state positioned at the end of the third direction as pass-through points, and the state positioned at the center of the end of the fourth direction as an end point, an n-bit code generated by a transition taking the state positioned at the center of the end of the fourth direction as a start point, any of the state positioned at the end of the third direction as pass-through points, and the state positioned at the center of the end of the first direction as an end point, an n-bit code generated by a transition taking the state positioned at the center of the end of the fourth direction as a start point, any of the state positioned at the end of the third direction as pass-through points, and the state positioned at the center of the end of the second direction as an end point, and an n-bit code generated by a transition taking the state positioned at the center of the end of the fourth direction as a start point and the state positioned at the center of the end of the third direction as an end point are allotted to the m-bit data, of n-bit codes generated in accordance with the state transition diagram, an n-bit code generated by a transition taking the state positioned at the center of the end of the third direction as a start point, any of the state positioned at the end of the fourth direction as pass-through points, and the state positioned at the center of the end of the third direction as an end point, an n-bit code generated by a transition taking the state positioned at the center of the end of the third direction as a start point, any of the state positioned at the end of the fourth direction as pass-through points, and the state positioned at the center of the end of the first direction as an end point, an n-bit code generated by a transition taking the state positioned at the center of the end of the third direction as a start point, any of the state positioned at the end of the fourth direction as pass-through points, and the state positioned at the center of the end of the second direction as an end point, and an n-bit code generated by a transition taking the state positioned at the center of the end of the third direction as a start point and the state positioned at the center of the end of the fourth direction as an end point are allotted to the m-bit data, of n-bit codes generated in accordance with the state transition diagram, an n-bit code generated by a transition taking the state positioned at the center of the end of the first direction as a start point, any of the state positioned at the end of the fourth direction as pass-through points, and the state positioned at the center of the end of the third direction as an end point, an n-bit code generated by a transition taking the state positioned at the center of the end of the first direction as a start point, both of any of the state positioned at the end of the third direction and any of the state positioned at the end of the fourth direction as pass-through points, and the state positioned at the center of the end of the first direction as an end point, an n-bit code generated by a transition taking the state positioned at the center of the end of the first direction as a start point, any of the state positioned at the end of the fourth direction as pass-through points, and the state positioned at the center of the end of the second direction as an end point, and an n-bit code generated by a transition taking the state positioned at the center of the end of the first direction as a start point and the state positioned at the center of the end of the fourth direction as an end point are allotted to the m-bit data, and of n-bit codes generated in accordance with the state transition diagram, an n-bit code generated by a transition taking the state positioned at the center of the end of the second direction as a start point, any of the state positioned at the end of the third direction as pass-through points, and the state positioned at the center of the end of the fourth direction as an end point, an n-bit code generated by a transition taking the state positioned at the center of the end of the second direction as start points, both of any of the state positioned at the end of the fourth direction and any of the state positioned at the end of the third direction as pass-through points, and the state positioned at the center of the end of the second direction as an end point, an n-bit code generated by a transition taking the state positioned at the center of the end of the second direction as a start point, any of the state positioned at the end of the third direction as pass-through points, and the state positioned at the center of the end of the first direction as an end point, and an n-bit code generated by a transition taking the state positioned at the center of the end of the second direction as a start point and the state positioned at the center of the end of the third direction as an end point are allotted to the m-bit data.

6. A code demodulation method of converting n-bit code into m-bit data, comprising:

a first step of receiving the n-bit code; and a second step of outputting m-bit data corresponding to the n-bit code, the n-bit code being a code generated in accordance with a state transition diagram comprising P×Q states, where P and Q are positive integers, the state transition diagram being provided with a space defined by a first axis and a second axis with the P×Q states being arranged therein, and having a code 00 being allotted upon a transition from a prescribed state to another state in a first direction along the first axis, a code 11 being allotted upon a transition from a prescribed state to another state in a second direction opposite to the first direction along the first axis, a code 01 being allotted upon a transition from a prescribed state to another state in a third direction along the second axis, and a code 10 being allotted upon a transition from a prescribed state to another state in a fourth direction opposite to the third direction along the second axis, and the codes allotted to each of the transitions being combined to construct the n-bit code.

7. A code demodulation method according to claim 6, wherein P×Q is 3×3.

8. A code demodulation method according to claim 7, wherein n is 12 and m is 8.

9. A code detection method comprising:

a first step of receiving n-bit code being transmitted, the n-bit code being a code generated in accordance with a state transition diagram comprising P×Q states, where P and Q are positive integers, the state transition diagram being provided with a space defined by a first axis and a second axis with the P×Q states being arranged therein, and having a code 00 being allotted upon a transition from a prescribed state to another state in a first direction along the first axis, a code 11 being allotted upon a transition from a prescribed state to another state in a second direction opposite to the first direction along the first axis, a code 01 being allotted upon a transition from a prescribed state to another state in a third direction along the second axis, and a code 10 being allotted upon a transition from a prescribed state to another state in a fourth direction opposite to the third direction along the second axis, and the codes allotted to each of the transitions being combined to construct the n-bit code;

a second step of giving intersymbol interference to the received n-bit code using a partial response (1, 1) characteristic; and a third step of detecting the n-bit code to which the intersymbol interference is given in the second step using Viterbi detection, the third step carrying out the Viterbi detection in accordance with a state transition diagram which comprises 2×Q states and arranges demodulation states of the 2×Q states along a third and fourth axis, and providing a code 00 being outputted when 0−1 is inputted upon a transition from a prescribed state to another state in a fifth direction along the third axis, a code 11 being inputted when 0+1 is inputted upon a transition from a prescribed state to another state in a sixth direction opposite to the fifth direction along the third axis, a code 01 being outputted when 00 is inputted upon a transition from a prescribed state to another state in a seventh direction along the fourth axis, a code 10 being outputted when 00 is inputted upon a transition from a prescribed state to another state in an eighth direction opposite to the seventh direction along the fourth axis, a code 10 being outputted when 10 is inputted upon a transition from a prescribed state to another state in a ninth direction along a fifth axis intersecting the fourth and third axes, a code 01 being outputted when −10 is inputted upon a transition from a prescribed state to another state along a tenth direction opposite to the ninth direction along the fifth axis, 00 being outputted when −1−1 is inputted upon a transition from a state arranged along the fourth axis at the end of the fifth direction to the same state, and 11 being outputted when 11 is inputted upon a transition from a state arranged along the fourth axis at the end of the sixth direction to the same state.

10. A code detection method according to claim 9, further comprising a fourth step of outputting m-bit data corresponding to the n-bit code obtained in the third step.

11. A code detection method according to claim 9, wherein P is 3 and Q is 3.

* * * * *